United States Patent
Chang et al.

(10) Patent No.: US 6,842,040 B1
(45) Date of Patent: Jan. 11, 2005

(54) DIFFERENTIAL INTERCONNECTION CIRCUITS IN PROGRAMMABLE LOGIC DEVICES

(75) Inventors: Wanli Chang, Saratoga, CA (US); Andy Lee, San Jose, CA (US); Cameron McClintock, Mountain View, CA (US); Richard Cliff, Los Altos, CA (US); Richard Yen-Hsiang Chang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/319,329

(22) Filed: Dec. 13, 2002

Related U.S. Application Data

(63) Continuation of application No. 09/853,439, filed on May 10, 2001, now Pat. No. 6,515,508.
(60) Provisional application No. 60/209,513, filed on Jun. 5, 2000.

(51) Int. Cl.[7] ............................................ H03K 19/177
(52) U.S. Cl. .............................. 326/38; 326/39; 326/40; 326/41; 326/86
(58) Field of Search ..................................... 326/38–41

(56) References Cited

U.S. PATENT DOCUMENTS

| | | | |
|---|---|---|---|
| 3,473,160 A | 10/1969 | Wahlstrom ............... 340/172.5 |
| 5,389,735 A | * 2/1995 | Bockelman .................. 174/33 |
| 5,666,354 A | 9/1997 | Cecchi et al. ............... 370/284 |
| 5,909,126 A | 6/1999 | Cliff et al. ..................... 326/41 |
| 5,963,049 A | 10/1999 | Cliff et al. ..................... 326/41 |
| 5,982,192 A | 11/1999 | Saito ........................... 326/30 |
| 6,025,742 A | 2/2000 | Chan .......................... 327/108 |
| 6,028,455 A | 2/2000 | Yamauchi ..................... 327/52 |
| 6,236,231 B1 | * 5/2001 | Nguyen et al. ................ 326/39 |
| 6,353,334 B1 | 3/2002 | Schultz et al. ................ 326/82 |
| 6,515,508 B1 | * 2/2003 | Chang et al. .................. 326/38 |

OTHER PUBLICATIONS

Xilinx, Multi–Drop LVDS with Virtex–E FPGAs, Sep. 1999, by Brunetti et al. pp. 1–11.

* cited by examiner

Primary Examiner—Vibol Tan
(74) Attorney, Agent, or Firm—Townsend and Townsend and Crew LLP

(57) ABSTRACT

At least some of the interconnection signaling on a programmable logic device ("PLD") is by differential signaling using differential driver circuitry to apply differential signals to a pair of conductors that extend to differential receiver circuitry. Such differential interconnection signaling helps the PLD operate satisfactorily with lower power supply voltages. The conductors in each differential signaling pair may cross over one another at various intervals in order to help reduce the adverse effects of capacitive coupling between adjacent and parallel signaling paths.

24 Claims, 11 Drawing Sheets

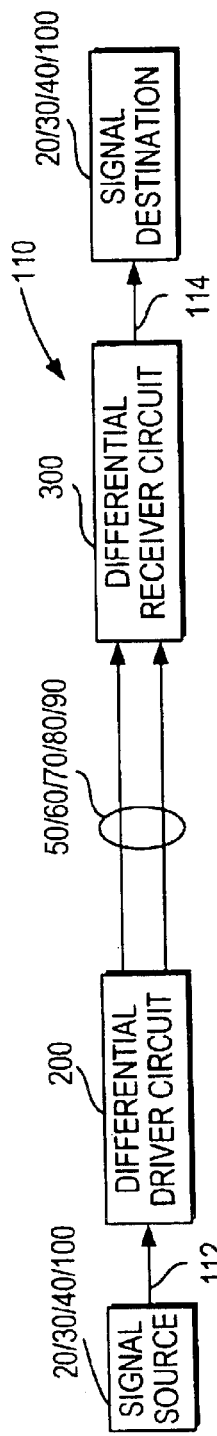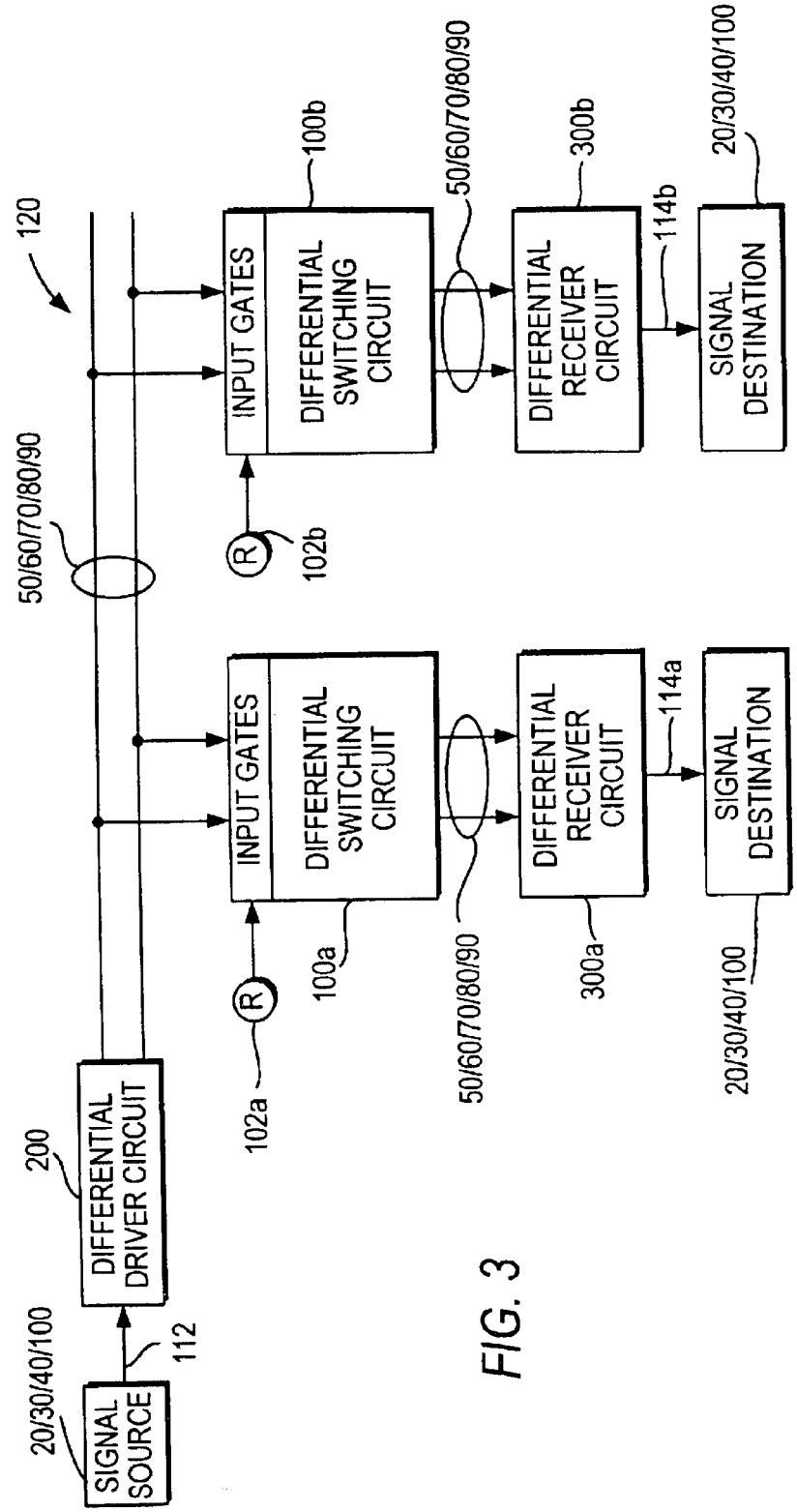

DIFFERENTIAL INTERCONNECTION CIRCUITS IN PROGRAMMABLE LOGIC DEVICES

This application is a continuation of U.S. patent application No. 09/853,439, now U.S. Pat. No. 6,515,508, filed May 10, 2001, which claims the benefit of U.S. provisional patent application 60/209,513, filed Jun. 5, 2000. All of the prior applications are hereby incorporated by reference herein in their entireties.

BACKGROUND OF THE INVENTION

This invention relates to programmable logic integrated circuit devices, and more particularly to the interconnection circuitry used in such devices. Examples of known programmable logic devices ("PLDs") are shown in Cliff et al. U.S. Pat. Nos. 5,909,126 and 5,963,049.

PLDs typically include large numbers of regions of programmable logic and other resources such as memory, input/output circuits, etc., that are selectively interconnectable via programmable interconnection resources on the device. For example, each region of programmable logic on a PLD may be programmable to perform any of several relatively simple logic functions on several input signals applied to that region in order to produce one or more output signals indicative of the result of performing the selected logic function(s) on the input signals. The interconnection resources are programmable to convey signals to, from, and between the logic regions in any of a wide variety of patterns or configurations. For example, the interconnection resources may be used to concatenate several logic regions so that much more complex logic tasks can be performed than any one logic region can perform.

It is now typical to use a single conductor for each individual interconnection pathway or path segment in PLDs. Single NMOS pass gates (controlled by programmable memory elements or circuits on the PLD) are used for selectively interconnecting each conductor to other conductors to provide various signal routings through the interconnection resources of the device.

One trend in the design of PLDs is toward the use of lower power supply voltage and therefore lower internal signaling voltage. At lower power supply voltage the Vt drop of NMOS pass gates becomes a more significant fraction or percentage of the power supply voltage. This can lead to several problems in conventional PLD interconnection circuitry. For example, signaling slows down and the circuitry becomes increasingly susceptible to capacitive cross-talk between parallel conductors.

SUMMARY OF THE INVENTION

In accordance with the principles of this invention, differential signaling circuitry is used on a PLD. This differential signaling circuitry includes driver circuitry for converting a single input signal to a pair of differential signals. Two conductors are used to convey the differential signals from the driver circuitry. Receiver circuitry receives the two differential signals and converts them back to a single output signal. If switching or programmable routing is needed between the driver and the receiver, programmably controlled differential switching circuitry may be used to selectively connect two conductors to two other conductors. If a conductor pair may be driven by more than one driver, each driver may have programmably controlled connections to that conductor pair. Similarly, if a conductor pair may supply signals to more than one receiver, each receiver may have programmably controlled connections to that conductor pair. The adverse effects of capacitive coupling between a pair of differential signaling conductors and one or more other conductors that are adjacent and parallel to the differential signaling conductors may be reduced by effectively twisting the conductors in the differential signaling pair along the length of those conductors.

Further features of the invention, its nature and various advantages will be more apparent from the accompanying drawings and the following detailed description.

BRIEF DESCRIPTION OF THE DRAWINGS

FIG. 2 is a simplified schematic block diagram of illustrative differential signaling circuitry in accordance with the invention.

FIG. 3 is a simplified schematic block diagram of other illustrative differential signaling circuitry in accordance with the invention.

DETAILED DESCRIPTION

Figure 1:
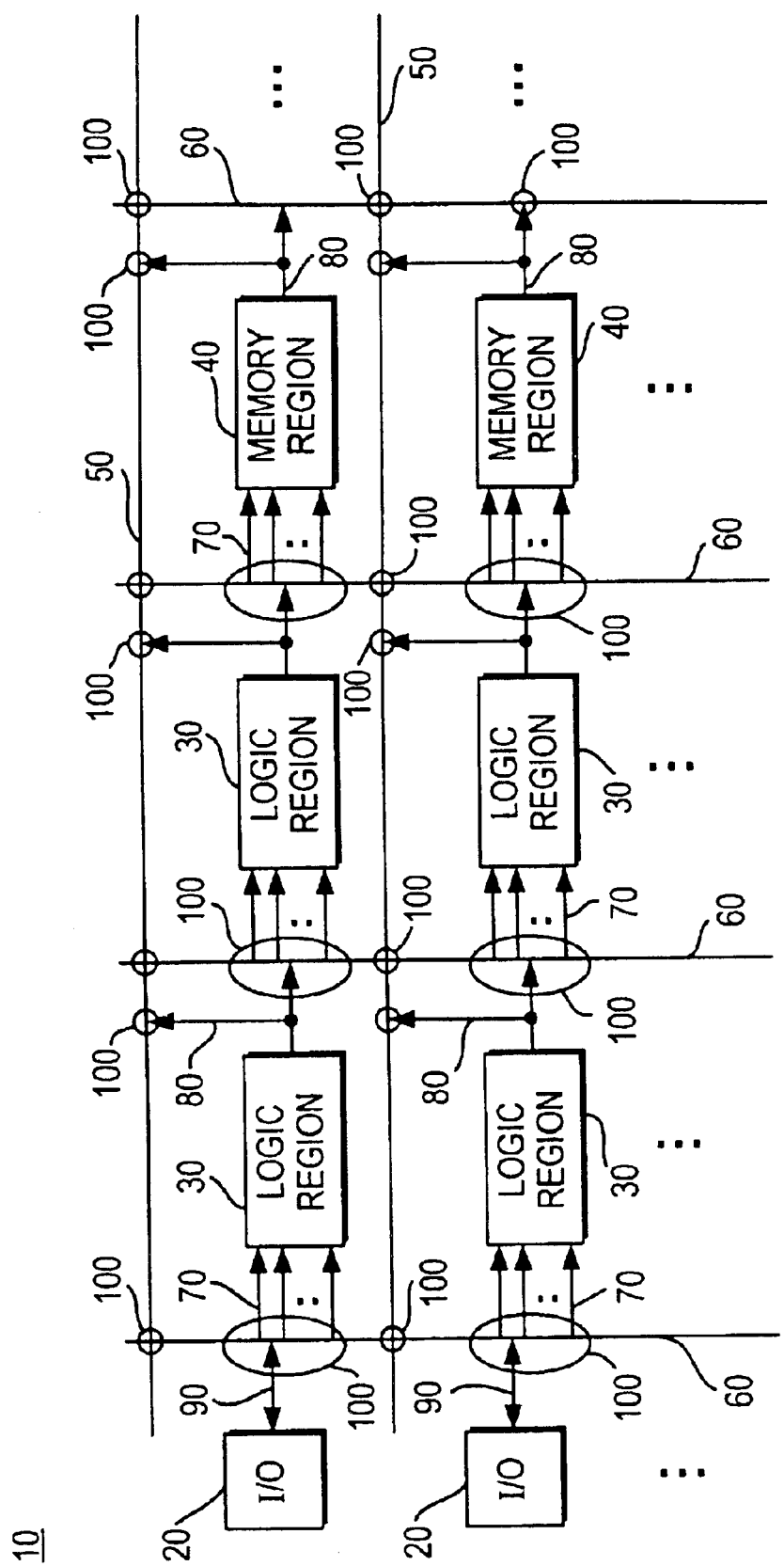
FIG. 1 is a simplified schematic block diagram of a representative portion of an illustrative PLD which can be constructed in accordance with the invention.

FIG. 1 shows a representative portion of an illustrative PLD 10 that can be constructed in accordance with the invention. PLD 10 includes regions 20 of input/output ("I/O") circuitry, regions 30 of programmable logic, and regions 40 of user-accessible memory. Other types of operational circuitry (e.g., microprocessor circuitry) may also be included on PLD 10. For example, such other circuitry may be in addition to what is shown in FIG. 1, or it may take the place of some of regions 40. Interconnection resources are also included on PLD 10. These resources include horizontal interconnection resources 50, vertical interconnection resources 60, region feeding resources 70, region output resources 80, and I/O serving resources 90. (Single lines in FIG. 1 may represent multiple, substantially parallel conductors.) The interconnection resources also include programmable connections between the various types of other interconnection resources. These programmable connections are represented by the circles or other shapes indicated by reference numbers 100 at the intersections of possibly connectable conductors.

The interconnection resources are programmable to connect substantially any signal source to substantially any signal destination in PLD 10. As just one example of this, a signal from upper left I/O region 20 can be routed through the interconnection resources to the lowest input 70 to the logic region 30 nearest the center of FIG. 1. Various ones of resources 50, 90, and 100 are used to provide such routing. As another example, an output signal of the upper left logic region 30 can be routed to the uppermost input 70 of the logic region 30 nearest the center of FIG. 1. Various ones of resources 50, 60, 80, and 100 are used to provide such routing.

Any or all of routing resources 50, 60, 70, 80, 90, and 100 may be differential signaling circuits in accordance with this invention. (Any of these resources that are not constructed as differential signaling circuits can be constructed as conventional single-conductor circuitry. In such single-conductor circuitry programmable connections 100 can be relatively simple and conventional programmable logic connectors ("PLCs") controlled by conventional programmable function control elements ("FCEs").)

FIG. 2 shows one illustrative differential signaling path 110 on PLD 10 (FIG. 1) in accordance with this invention. The source of the signal in path 110 can be any of an I/O region 20, a logic region 30, a memory region 40, a programmable interconnection 100, or any other signal source on PLD 10. A signal 112 produced by source 20/30/40/100 is applied to differential driver circuit 200. Circuit 200 converts signal 112 from single-conductor form to differential form on two conductors that can be any of types 50, 60, 70, 80, or 90 or any other type of conductor used on PLD 10. The two conductors 50/60/70/80/90 extending from circuit 200 run to differential receiver circuit 300. Circuit 300 converts the differential signals on conductors 50/60/70/80/90 back to single-conductor form 114 for application to the associated signal destination, which (like the signal source) can be any of an I/O region 20, a logic region 30, a memory region 40, a programmable interconnection 100, or any other signal destination on PLD 10. Details of illustrative constructions of circuits 200 and 300 in accordance with this invention are provided later in this specification.

Another illustrative differential signaling path arrangement 120 in PLD 10 (FIG. 1) in accordance with the invention is shown in FIG. 3. The signal source element 20/30/40/100, the differential driver circuit element 200, and the output conductors 50/60/70/80/90 of element 200 can be similar to the corresponding elements in FIG. 2. The horizontal conductors 50/60/70/80/90 are connected to the input gates of each of two (or more) differential switching circuits 100a and 10b. The input gates of each of circuits 100 are controlled by an associated programmable function control element ("FCE") 102a/102b. If it is desired for a circuit 100 to input and pass on the differential signals on the horizontal conductors 50/60/70/80/90, the FCE 102 associated with that circuit 100 is programmed to enable the input gates of that circuit. The circuit 100 can then receive and pass on to the associated vertical conductors 50/60/70/80/90 the differential signals on the horizontal conductors 50/60/70/80/90. Each differential receiver circuit 300a or 300b that thus receives differential signals converts those signals to a single-conductor signal 114 for use by the associated signal destination element 20/30/40/100. The differential receiver circuit elements 300 in FIG. 3 can each be similar to element 300 in FIG. 2, and the signal destination elements 20/30/40/100 in FIG. 3 can each be similar to the signal destination element in FIG. 2.

Figure 4:
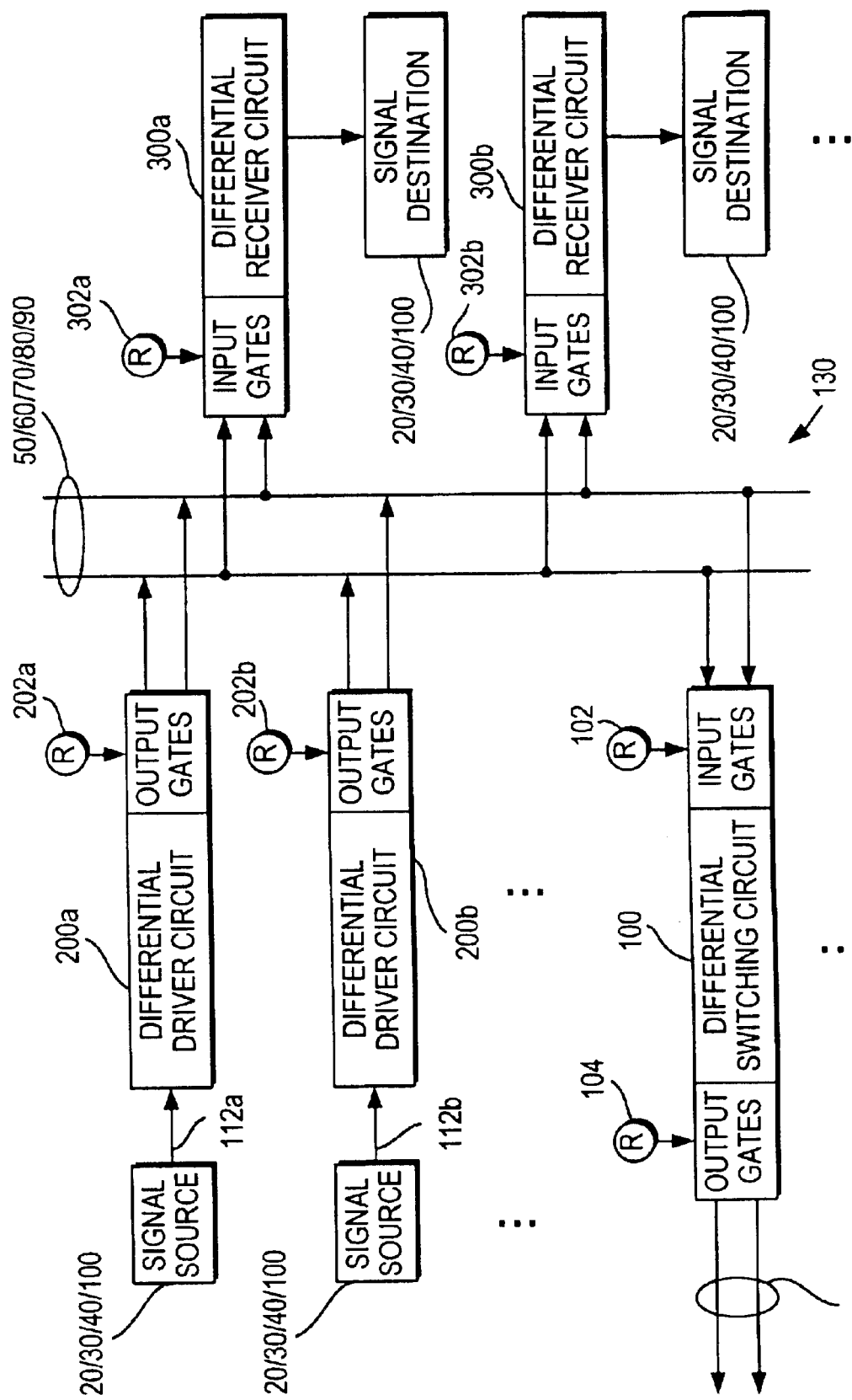
FIG. 4 is a simplified schematic block diagram of still other illustrative differential signaling circuitry in accordance with the invention.

Still another illustrative differential signaling arrangement 130 in PLD 10 (FIG. 1) in accordance with this invention is shown in FIG. 4. Each signal source element 20/30/40/100 in FIG. 4 can be similar to the signal source elements in FIGS. 2 and 3. Each differential driver circuit 200 in FIG. 4 can be similar to differential driver circuits 200 in FIGS. 2 and 3, except that in FIG. 4 each circuit 200 is shown having output gates controlled by FCEs 202. Thus each circuit 200 in FIG. 4 outputs two differential signals only when the associated output gates are enabled by the associated FCE 202. In this way vertical differential interconnection conductors 50/60/70/80/90 can be driven by either of two (or more) differential driver circuits 200.

Each differential receiver circuit 300 in FIG. 4 is similar to differential receiver circuits 300 in FIGS. 2 and 3, except that in FIG. 4 each circuit 300 is shown having input gates controlled by FCEs 302. Thus each circuit 300 receives and processes differential signals from vertical conductors 0.50/60/70/80/90 only if its associated input gates are enabled by the associated FCE 302. Each signal destination element 20/30/40/100 in FIG. 4 is similar to the signal destination elements in FIGS. 2 and 3.

Differential switching circuit element 100 in FIG. 4 is similar to any of the differential switching circuit elements 100 in FIG. 3, except that in FIG. 4 circuit 100 additionally has output gates controlled by FCE 104. Thus circuit 100 in FIG. 4 outputs differential signals only if its output gates are enabled by the associated FCE 104.

From the illustrative examples shown in FIGS. 2–4, it will be understood how any or all of the interconnection resources 50/60/70/80/90/100 in illustrative PLD 10 (FIG. 1) can be differential signaling circuitry in accordance with this invention. As has been said, any of resources 50/60/70/80/90/100 that are not provided as differential signaling circuitry can be more conventional single-conductor interconnection resources.

Figure 5:
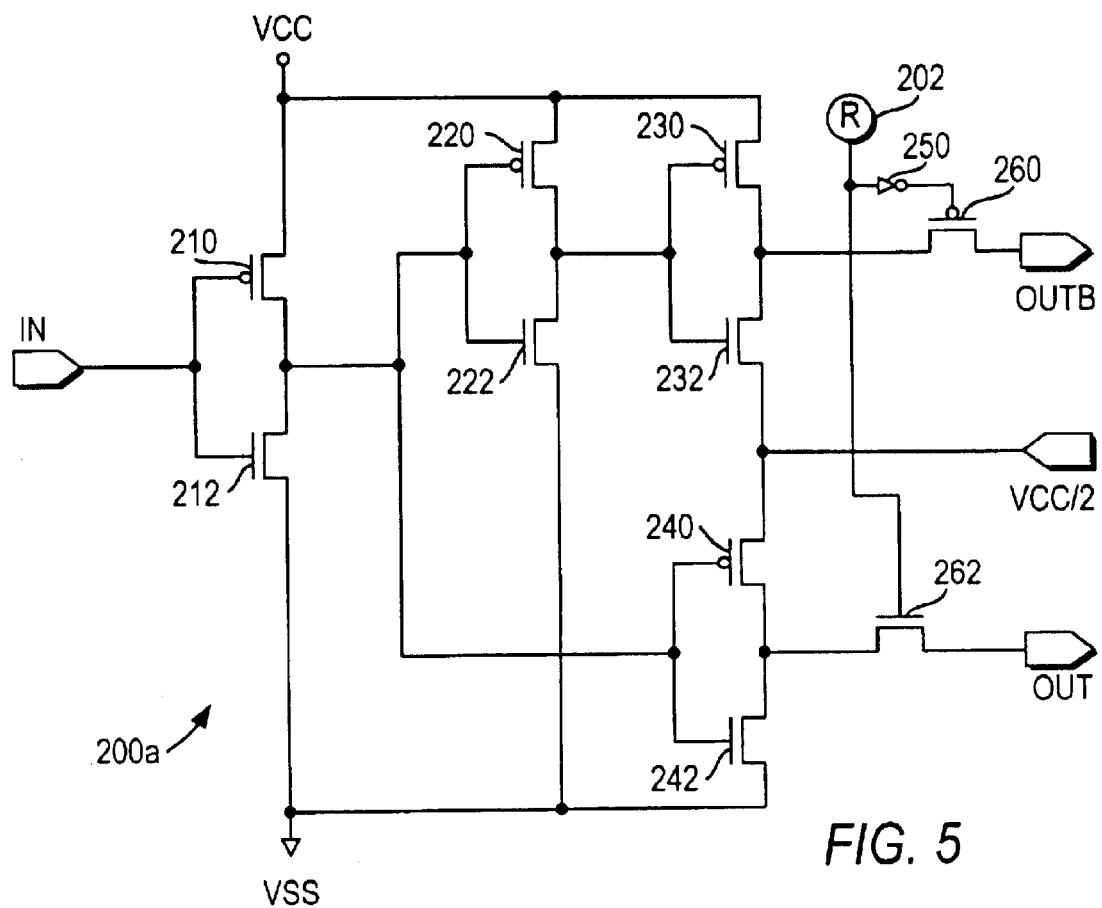
FIG. 5 is a simplified schematic diagram of illustrative differential driver circuitry in accordance with the invention.

An illustrative embodiment of a differential driver circuit 200a is shown in more detail in FIG. 5. (Reference numbers with letter suffixes like 200a, 200b, 300a, 300b, 100a, 100b, etc. are used in FIGS. 5–13 to help distinguish different illustrative embodiments of generally similar circuits. In earlier FIGS. similar reference numbers with letter suffixes are used for a different purpose (i.e., to distinguish different instances of the same circuitry). It is not to be understood, for example, that the circuitry 200a in FIG. 4 can only be constructed like embodiment 200a in FIG. 5. Rather, any of the embodiments 200a–f shown respectively in FIGS. 5, 7, 8, 9, 10, and 12 can be used for circuitry 200a in FIG. 4, or indeed for any instance of a driver circuit 200 in any of FIGS. 2–4.)

In FIG. 5 the signal from the associated signal source 20/30/40/100 is applied to the IN terminal. VCC is a source of power or logic 1 voltage or potential. VSS is ground or logic 0 voltage or potential. VCC/2 is a source of a reference voltage that is halfway between VCC and VSS. Elements 210, 220, 230, 240, and 260 are all PMOS transistors or gates. Elements 212, 222, 232, 242, and 262 are all NMOS transistors or gates. Element 202 is an FCE (described earlier). Element 250 is an inverter. OUT and OUTB are the two differential output signals of circuit 200a. Elements 202, 250, 260, and 262 are all optional and can be omitted for any circuit 200a that is the sole drive for the associated differential interconnection conductors 50/60/70/80/90. The differential signaling mode implemented by driver 200a in FIG. 5 is as follows: (1) IN high (logic 1) causes OUTB and OUT to be VCC/2; (2) IN low (logic 0) causes OUTB to be VCC and OUT to be VSS.

Operation of the differential driver circuit 200a shown in FIG. 5 is as follows. (This description assumes that if optional elements 202, 250, 260, and 262 are present, then FCE 202 is programmed to turn on transistors 260 and 262.) When IN as high; transistors 212, 220, 232, and 240 are all on, and transistors 210, 222, 230, and 242 are all off. Transistors 232 and 240 being on applies VCC/2 to OUTB and OUT, which is the above-described differential signaling state associated with a high IN signal. Conversely, when IN is low, transistors 212, 220, 232, and 240 are all off, and transistors 210, 222, 230, and 242 are all on. Transistor 230 being on applies VCC to OUTB, and transistor 242 being on connects OUT to VSS. This is the above-described differential signaling state associated with a low IN signal.

Figure 6:
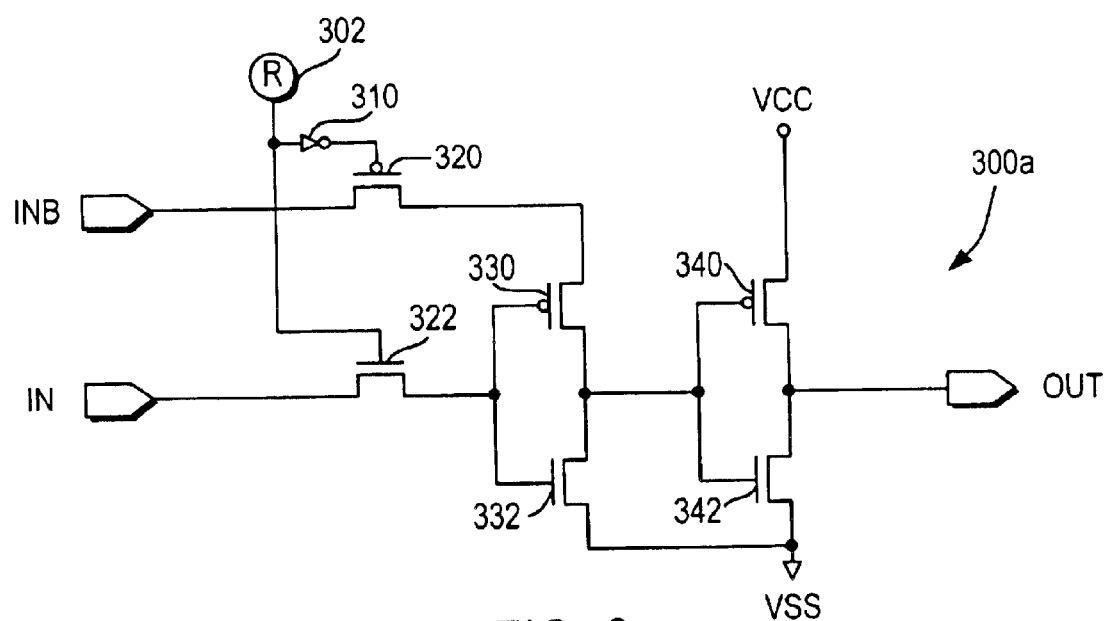
FIG. 6 is a simplified schematic diagram of illustrative differential receiver circuitry in accordance with the invention.

FIG. 6 shows in more detail an illustrative embodiment of a differential receiver circuit 300a. The receiver circuit 300a shown in FIG. 6 is usable to receive and process differential signals output by the differential driver circuit 200a shown in FIG. 5. The two differential signals applied to circuit 300a are received via the INB and IN terminals. In particular, if circuit 300a is receiving signals from circuit 200a in FIG. 5, the OUTB signal from FIG. 5 is connected to the INB terminal in FIG. 6, and the OUT signal from FIG. 5 is connected to the IN terminal in FIG. 6.

In FIG. 6 element 302 is an FCE as previously described in connection with FIG. 4. Element 310 is an inverter. Elements 320, 330, and 340 are all PMOS transistors or gates, and elements 322, 332, and 342 are all NMOS transistors or gates. VCC and VSS are as described above in connection with FIG. 5. OUT is the single-conductor output signal produced by circuit 300a in response to the differential input signals INB and IN. Elements 302, 310, 320, and 322 are optional and can be omitted if receiver 300a is the sole receiver connected to the associated differential signal conductors 50/60/70/80/90 or if receiver 300a is to operate in all possible configurations of PLD 10 (FIG. 1). The following discussion assumes that if optional elements 302, 310, 320, and 322 are present, FCE 302 is programmed to turn on transistors 320 and 322.

In the case in which receiver 300a in FIG. 6 receives differential signals from receiver 200a in FIG. 5, operation of the FIG. 6 circuitry is as follows. When INB and IN are both VCC/2, transistors 332 and 340 are both on and transistors 330 and 342 are both off. Transistor 34.0 being on applies VCC to the OUT terminal. Thus a logic 1 signal applied to the IN terminal of the associated FIG. 5 circuit causes the FIG. 6 circuit to output logic 1 at its OUT terminal. Conversely, when INB is VCC and IN is VSS, transistors 330 and 342 are on and transistors 332 and 340 are off. Transistor 342 being on connects the OUT terminal in FIG. 6 to VSS. Thus a logic 0 signal applied to the IN terminal of the associated FIG. 5 circuit results in the FIG. 6 circuit outputing logic 0 via its OUT terminal.

Compared to the traditional single-ended NMOS interconnect, the differential signaling circuitry of FIGS. 5 and 6 can operate at a lower supply voltage.

Figure 7:
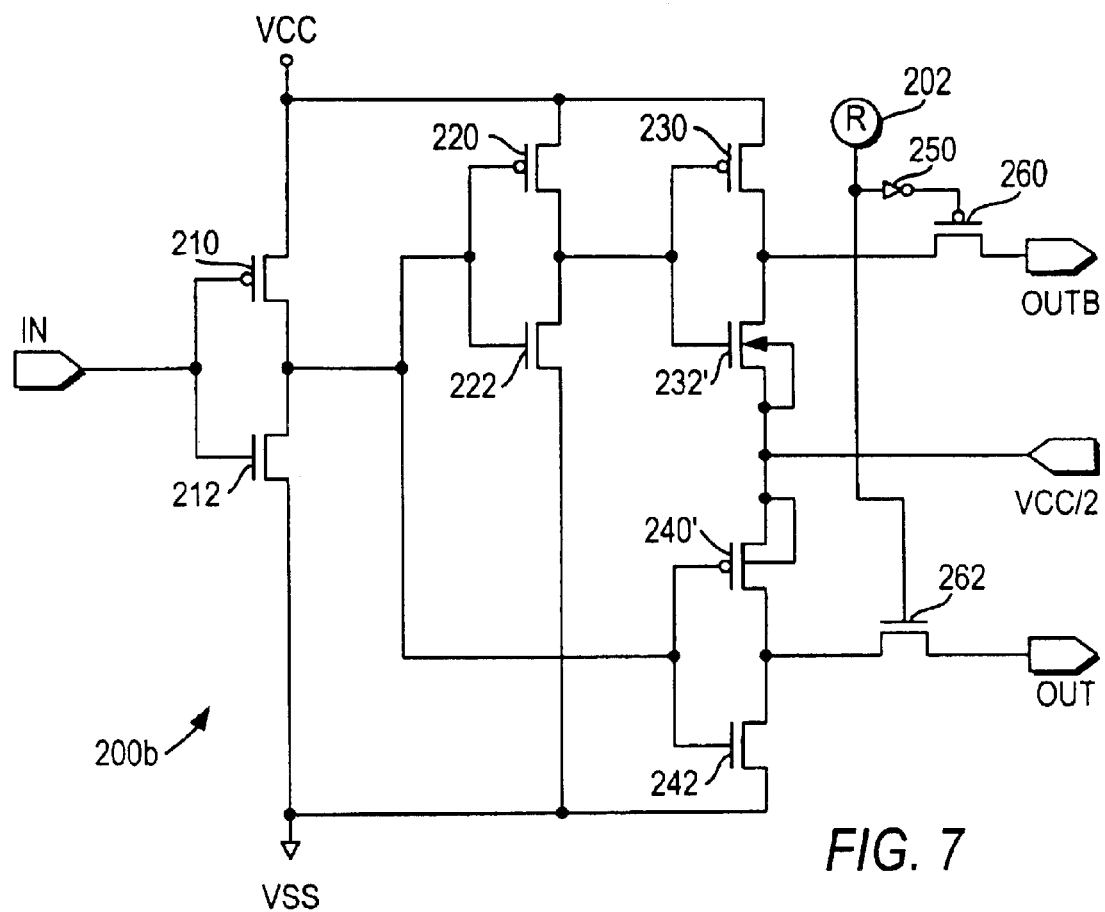
FIG. 7 is a simplified schematic diagram of other illustrative differential driver circuitry in accordance with the invention.

FIG. 7 shows a modified version 200b of the differential driver circuit 200a shown in FIG. 5. The only difference between FIG. 5 and FIG. 7 is that n FIG. 7 each of transistors 232' and 0.240° has its body tied to VCC/2. This makes circuit 200b faster than circuit 200a due to the elimination of the body effect in these transistors. Although circuit 200b is thus faster, a more complex triple-well process must be used to make transistors 232' and 240'. Because circuit 200b produces the same kind of differential signaling as circuit 200a, the receiver circuit 300a shown in FIG. 6 can also be used with FIG. 7 driver circuits.

Figure 8:
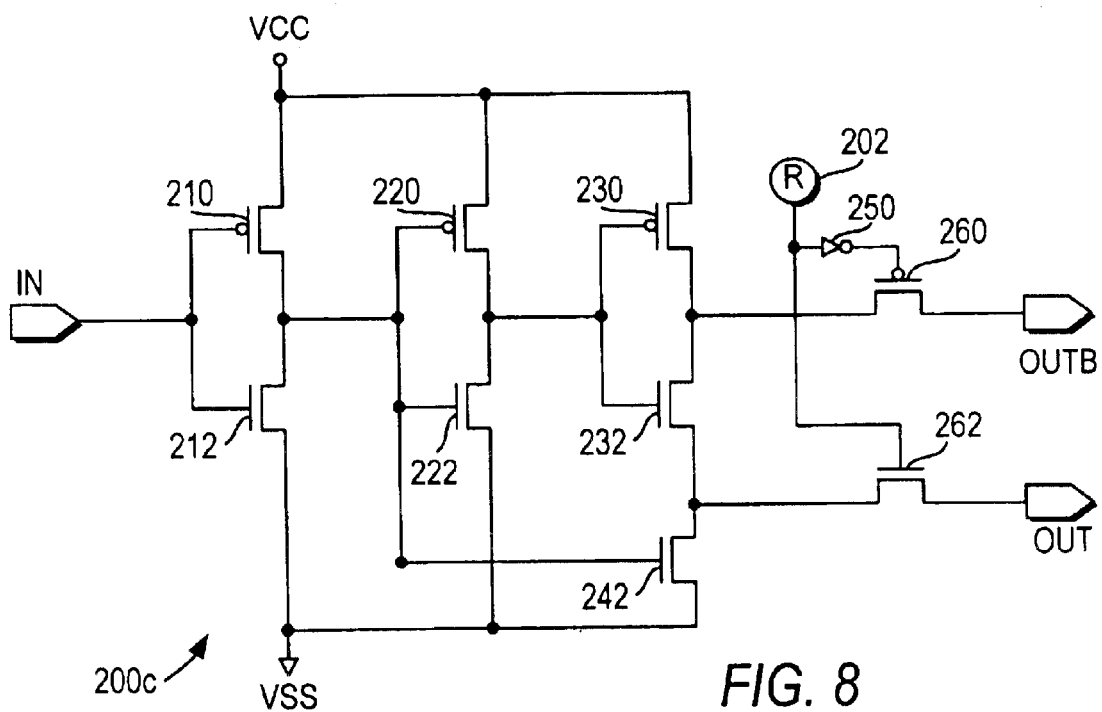
FIG. 8 is a simplified schematic diagram of still other illustrative differential driver circuitry in accordance with the invention.

FIG. 8 shows another modified version 200c of the differential driver circuit 200a shown in FIG. 5. When IN is low, circuit 200c operates very much like circuit 200a, producing OUTB=VCC and OUT=VSS differential output signals. When IN is high, however, circuit 200c produces OUTB=OUT=floating. Circuit 200c does not have the VCC/2 reference signal. Instead, when IN is high, because transistors 230 and 242 are both off and transistor 232 is on, OUTB and OUT are tied together with no driving voltage. OUTB and OUT therefore have a floating but common voltage or potential. A differential receiver circuit (like circuit 300a in FIG. 6) can distinguish this condition of the differential signals from the condition produced when IN is low. In all respects other than those mentioned specifically above, the construction and operation of circuit 200c can be similar to circuit 200a. Thus again, compared to the traditional single-ended NMOS interconnect, this differential signaling structure can operate at a lower supply voltage.

Figure 9:
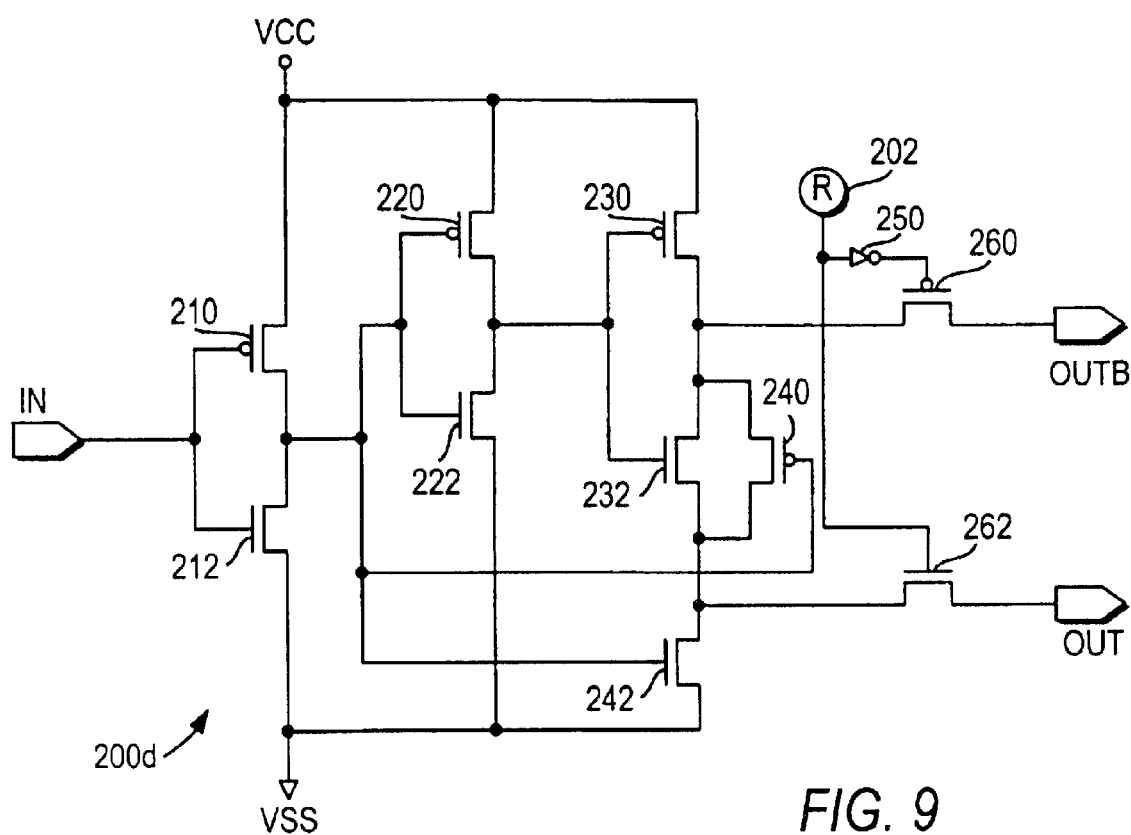
FIG. 9 is a simplified schematic diagram of yet another illustrative differential driver circuit in accordance with the invention.

FIG. 9 shows a modified version 200d of driver circuit 200c. In circuit 200d OUTB and OUT are connectable together by a full CMOS pass gate that includes parallel transistors 232 and 240. Circuit 200d operates like circuit 200c, except that pass gate 232/240 enables circuit 200d to bring OUTB and OUT together more rapidly when IN goes high. In all other respects the construction and operation of circuit 200d can be similar to circuit 200c. The differential receiver circuit 300a of FIG. 6 can again be used with the differential driver circuit 200d of FIG. 8.

Figure 10:
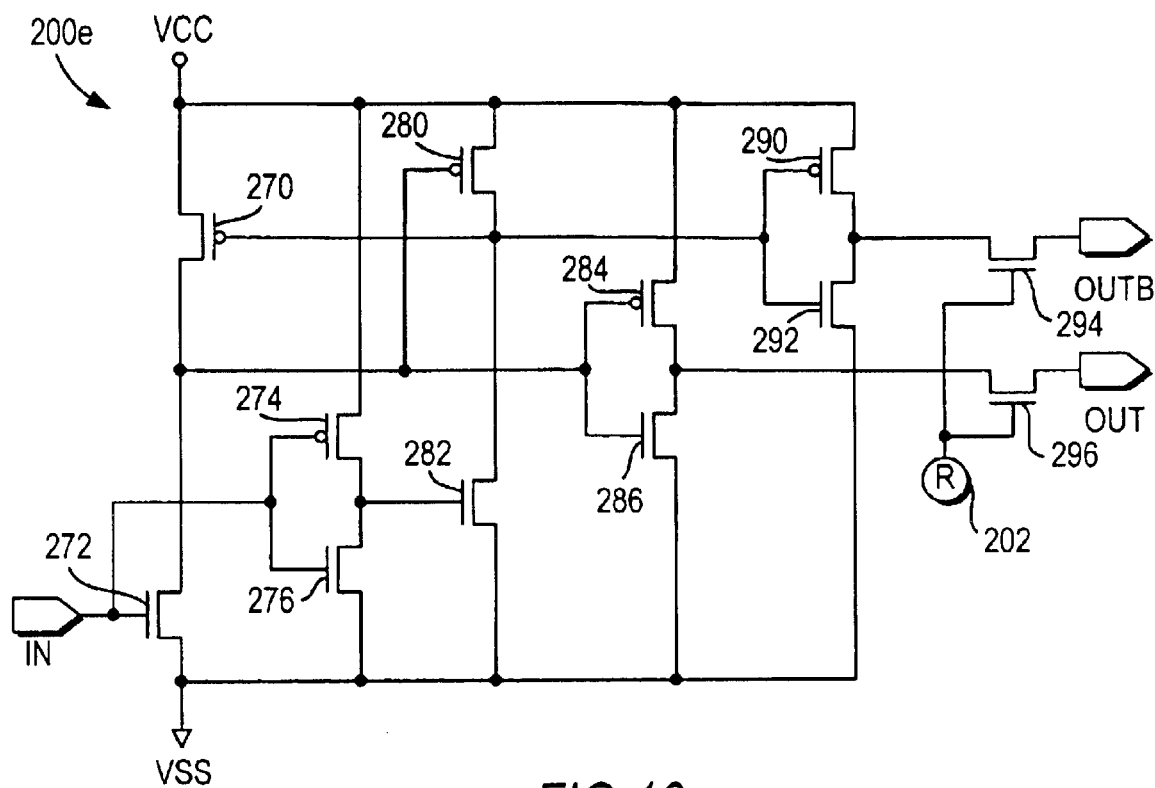
FIG. 10 is a simplified schematic diagram of still another illustrative differential driver circuit in accordance with the invention.

Still another illustrative differential driver circuit 200e is shown in FIG. 10., This circuitry (and the associated differential receiver circuitry shown in FIG. 11 and described later) uses differential cascade voltage swing logic ("DCVSL"). When IN is low, transistors 270, 274, 280, 286, and 290 are on and transistors 272, 276, 282, 284, and 292 are off. Assuming that transistors 294 and 296 are enabled by FCE 202, this condition produces differential output signals OUTB=VCC−Vtn and OUT=VSS (where Vtn is the voltage drop due to transistor 294). When IN is high, transistors 272, 276, 280, 284, and 292 are on and transistors 270, 274, 282, 286, and 290 are off. Again assuming that transistors 294 and 296 are enabled by FCE 202, this condition produces differential output signals OUTB=VSS and OUT=VCC−Vtn (where Vtn is the voltage drop due to transistor 296). (As in the other embodiments discussed earlier, elements 202, 294, and 296 are optional and can be omitted in appropriate circumstances.)

Figure 11:
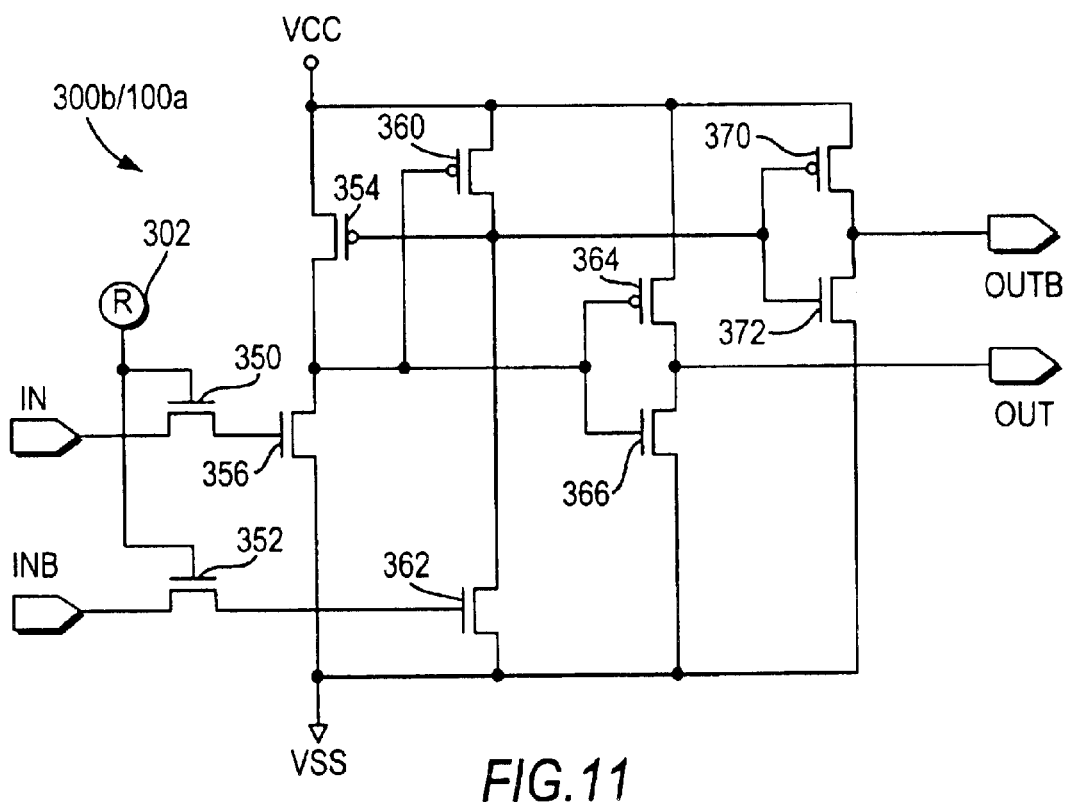
FIG. 11 is a simplified schematic diagram of other illustrative differential receiver circuitry or illustrative differential switching circuitry in accordance with the invention.

An illustrative differential receiver circuit 300b for use with driver circuit 200e (FIG. 10) is shown in FIG. 11. The circuitry shown in FIG. 11 is also illustrative of circuitry that is suitable for use as differential switching circuitry 100. The circuitry shown in FIG. 11 is therefore referred to by the general reference number 300b/10a. If this circuitry is being used as differential switching circuitry, then both of OUTB and OUT are used. (Output gate circuitry (similar to input gate circuitry 302/350/352 (which itself is optional) can be added just upstream from the OUTB and OUT terminals, if desired.) If circuitry 300b/100a is being used as differential receiver circuitry, then either the OUTB or OUT signal can be used as the single-conductor output signal of the receiver. The following further discussion of FIG. 11 assumes that input gate transistors 350 and 352 are enabled by FCE 302.

When used with differential driver circuitry 200e, the IN terminal of circuitry 300b/10a is connected to the OUT terminal of circuitry 200e, and the INB terminal of circuitry 300b/100a is connected to the OUTB terminal of circuitry 200e. When IN is high and INB is low, transistors 356, 260, 364, and 372 are on and transistors 354, 362, 366, and 370 are off. Because transistor 372 is on, OUTB is low; and because transistor 364 is on, OUT is high. When the inputs are reversed (i.e., IN low and INB high), transistors 354, 362, 366, and 370 are on and transistors 356, 360, 364, and 372 are off. Because transistor 370 is on, OUTB is high; and because transistor 366 is on, OUT is low.

Compared to the traditional single-ended NMOS interconnect, the differential signaling structure shown in FIGS. 10 and 11 can operate at a lower supply voltage.

Figure 12:
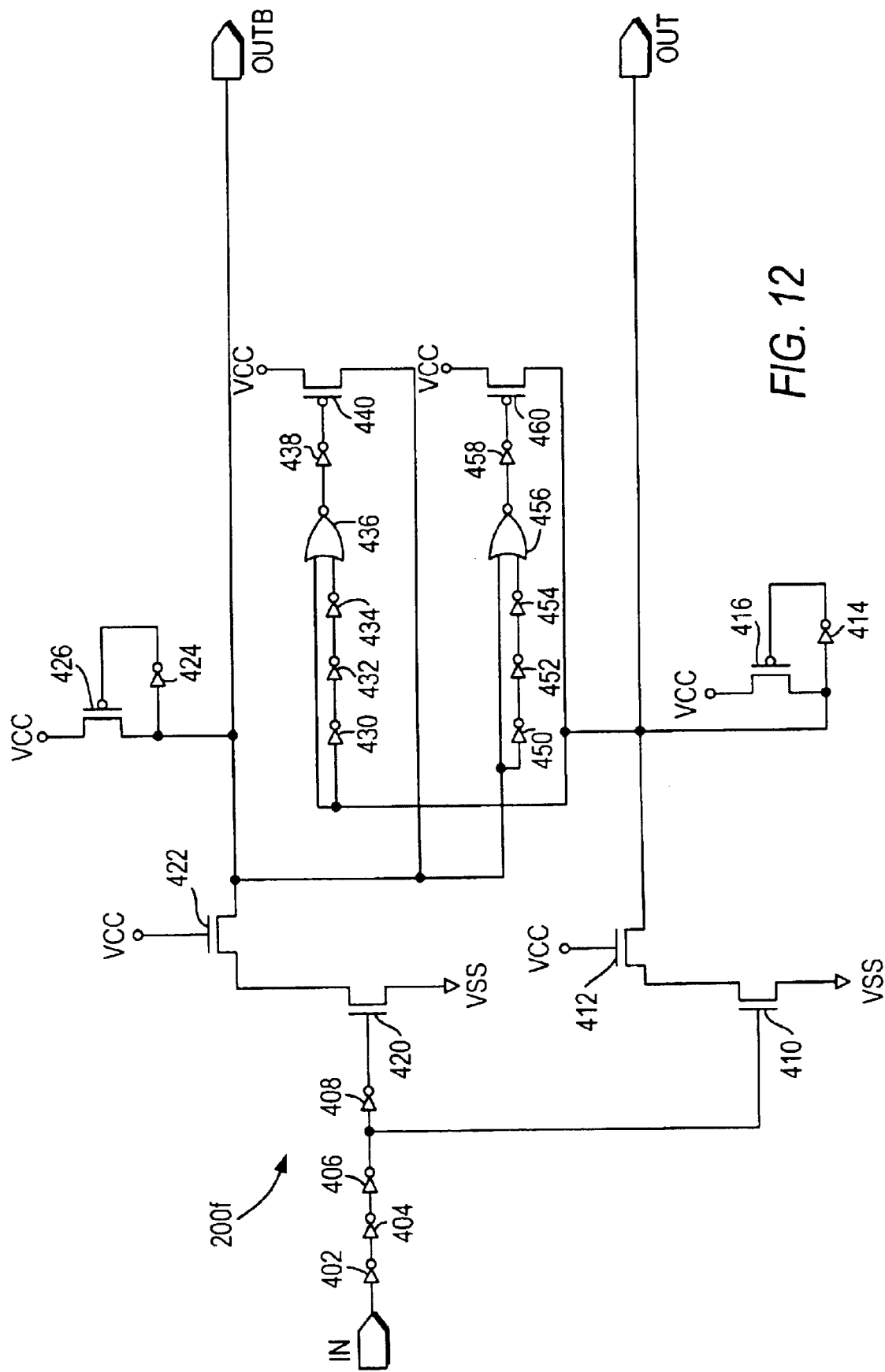
FIG. 12 is a simplified schematic diagram of yet another illustrative differential driver circuit in accordance with the invention.
Figure 13:
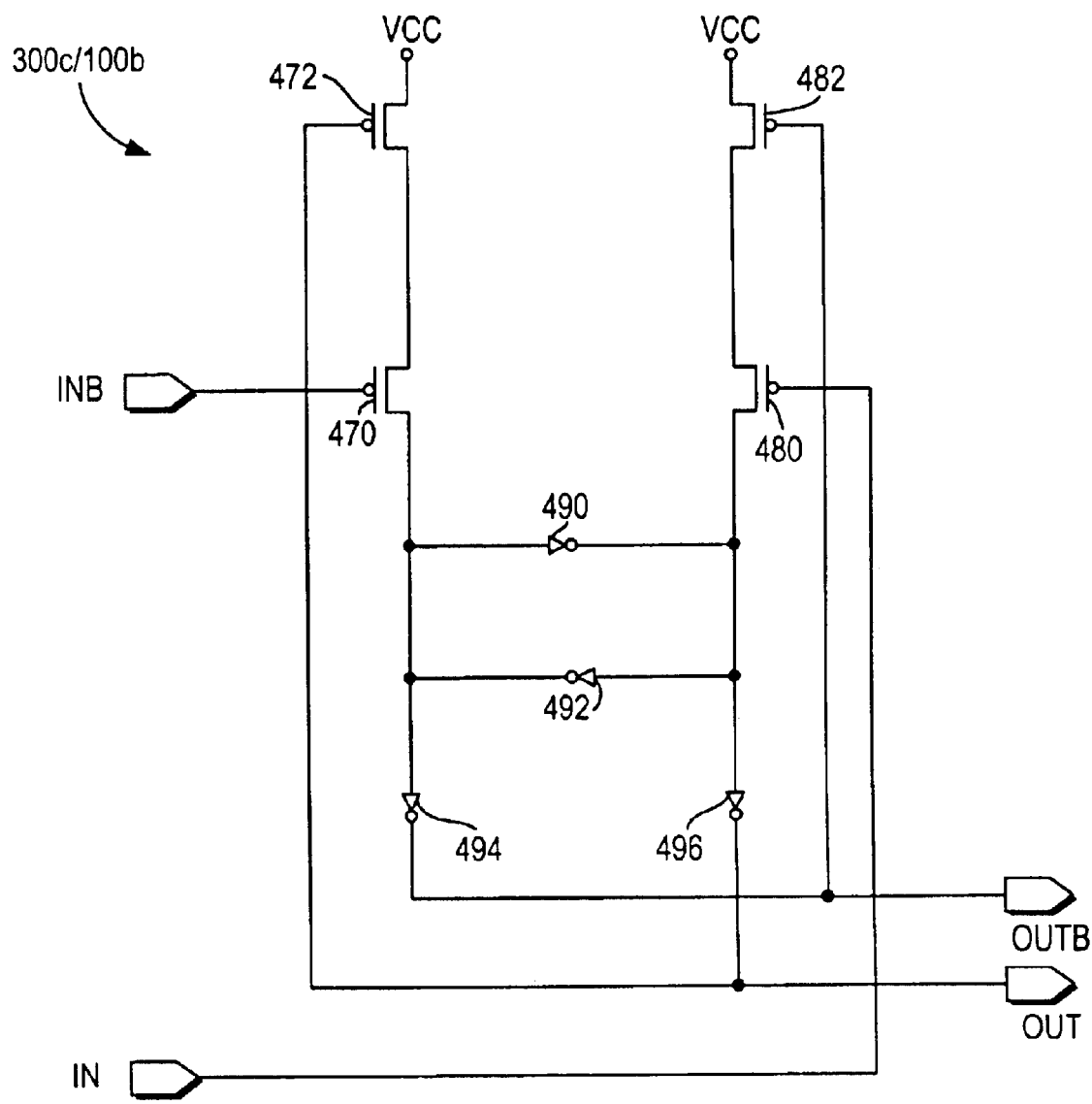
FIG. 13 is a simplified schematic diagram of still other illustrative differential receiver circuitry or illustrative differential switching circuitry in accordance with the invention.

Yet another illustrative differential driver circuit 200f is shown in FIG. 12, and circuitry that can be used with circuitry 200f as either differential receiver circuitry 300c or differential switching circuitry 100b is shown in FIG. 13. FCE-controlled output gates are not shown in FIG. 12 for driver circuit 200f, but it will be apparent from the earlier discussion how such output gates can be added if desired. Similarly, neither FCE-controlled input gates nor FCE-controlled output gates are shown in FIG. 13 for circuitry 300c/100b, but it will be apparent how such gates can be added if desired.

The signaling employed by circuitry 200f/300c/100b is as follows: when IN is low (i.e., VSS or logic 0), OUT is low and OUTB is high; and when IN is high (i.e., VCC or logic 1), OUT is high and OUTB is low. When circuits 200f and 300c/100b are used together, OUT and OUTB in FIG. 12 are respectively connected to IN and INB in FIG. 13 via whatever interconnection conductors 50/60/70/80/90 are used between those circuits. If circuitry 300c/100b is used as a differential receiver, then either OUT or OUTB in FIG. 13 can be used as the single-conductor output signal applied to the signal destination circuitry, depending on the output polarity that is desired. It circuitry 300c/100b is used as differential switching circuitry, then both OUT and OUTB in FIG. 13 are used to provide differential output signals that are similar to the OUT and OUTB signals in FIG. 12. In the following discussion of circuit operation, both of FIGS. 12 and 13 are discussed together.

To begin the discussion of the operation of FIGS. 12 and 13, it is assumed that the initial condition of the IN signal is low (i.e., VSS or logic 0). After passing through inverters 402, 404, and 406, the resulting signal is high, which turns on NMOS transistor 410. After passing through another inverter 408, the resulting signal is low, which turns off NMOS transistor 420. Turned-on transistor 410 connects the OUT terminal (FIG. 12) to ground (VSS) via always-on NMOS transistor 412. Turned-off transistor 420 prevents the OUTB terminal (FIG. 12) from being connected to ground via always-on NMOS transistor 422. Because the OUTB terminal is thus not held low, the output signal of inverter 424 tends to be low, which turns on PMOS transistor 426, thereby connecting the OUTB terminal to VCC. (Elements 424 and 426 constitute what may be called a half latch. Elements 414 and 416 are another similar half latch.) Because the OUT terminal is low, the output signal of inverter 438 is high and PMOS transistor 440 is off. (The full operation of elements 430, 432, 434, 436, 438, and 440 will be discussed in more detail later.) PMOS transistor 460 will similarly be off because the OUTB terminal is high. (Again, the full operation of elements 450, 452, 454, 456, 458, and 460 will be discussed in more detail below.)

The effect of the above-described initial condition of circuit 200f (FIG. 12) on circuit 300c/100b (FIG. 13) will now be described. The low IN signal turns on PMOS transistor 480. The high INB signal turns off PMOS transistor 470. From these conditions it can be assumed that the input to inverter 490 is low, which makes the outputs of inverters 490 and 494 low and the output of inverter 496 high. Inverters 490 and 492 operate together to form a latch which latches in this condition. The high output of inverter 494 turns off PMOS transistor 482 and also makes the OUTB terminal (FIG. 13) high. The low output of inverter 496 turns on transistor 472 and also makes the OUT terminal (FIG. 13) low.

We now consider what happens when the IN signal in FIG. 12 transitions from low to high. Transistor 410 is turned off and transistor 420 is turned on. Turning on transistor 420 connects the OUTB terminal (FIG. 12) to ground. Because of the signal propagation delay through inverters 450, 452, and 454, the output signal of inverter 454 is still briefly 0 when the other input to NOR gate 456 goes to logic 0. This causes the output signal of NOR gate 456 to briefly be logic 1, which causes inverter 458 to briefly output logic 0 and thereby briefly turn on transistor 460. This brief turn-on of transistor 460 begins charging the OUT terminal (FIG. 12) to logic 1. This is sufficient to switch inverter 414 to output logic 0, which turns on transistor 416 to assist in driving the OUT terminal (FIG. 12) all the way to logic 1. It will be appreciated from the foregoing that elements 450, 452, 454, and 456 comprise a one-shot circuit.

Returning again to FIG. 13, the low OUTB signal from FIG. 12 makes the INB signal in FIG. 13 low, and the high OUT signal from FIG. 12 makes the IN signal in FIG. 13 high. With INB low, transistor 470 is turned on. Transistor 472 is also momentarily on. This connects the input terminal of inverter 490 to VCC, which causes inverter 490 to switch from outputing logic 1 to outputing logic 0. Inverter 492 also switches state to latch in this new signal state. Inverter 494 switches to output logic 0 so that OUTB (FIG. 13) becomes logic 0 and transistor 482 is turned on. Inverter 496 similarly switches to output logic 1 so that OUTB (FIG. 13) becomes logic 1 and transistor 472 is turned off. Turning on transistor 482 does not otherwise affect the circuit because transistor 480 is held off by the low IN signal.

Considering now what happens when IN (FIG. 12) transitions from high to low, transistor 410 is turned on and transistor 420 is turned off. Turning on transistor 410 connects the OUT terminal (FIG. 12) to ground. Because of the signal propagation delay through inverters 430, 432, and 434, the output signal of inverter 434 is still briefly 0 when the other input to NOR gate 436 goes to logic 0. This causes the output signal of NOR gate 436 to briefly be logic 1, which causes inverter 438 to briefly output logic 0 and thereby briefly turn on transistor 440. This brief turn-on of transistor 440 begins charging the OUTB terminal (FIG. 12) to logic 1. This is sufficient to switch inverter 424 to output logic 0, which turns on transistor 426 to assist in driving the OUT terminal (FIG. 12) all the way to logic 1. It will be appreciated from the foregoing that elements 430, 432, 434, and 436 comprise another one-shot circuit.

Returning once again to FIG. 13, the high OUTB signal from FIG. 12 makes the INB signal in FIG. 13 high, and the low OUT signal from FIG. 12 makes the IN signal in FIG. 13 low. With IN low, transistor 480 is turned on. Transistor 482 is also momentarily on. This connects the input terminal of inverter 492 to VCC, which causes inverter 492 to switch from outputing logic 1 to outputing logic 0. Inverter 490 also switches state to latch in this new signal state. Inverter 494 switches to output logic 1 so that OUTB (FIG. 13) becomes logic 1 and transistor 482 is turned off. Inverter 496 similarly switches to output logic 0 so that OUT (FIG. 13) becomes logic 0 and transistor 472 is turned on. Turning on transistor 472 does not otherwise affect the circuit because transistor 470 is held off by the high INB signal.

The embodiment shown in FIGS. 12 and 13 is one that can operate very satisfactorily even with relatively low power supply voltage. VCC.

Figure 14:
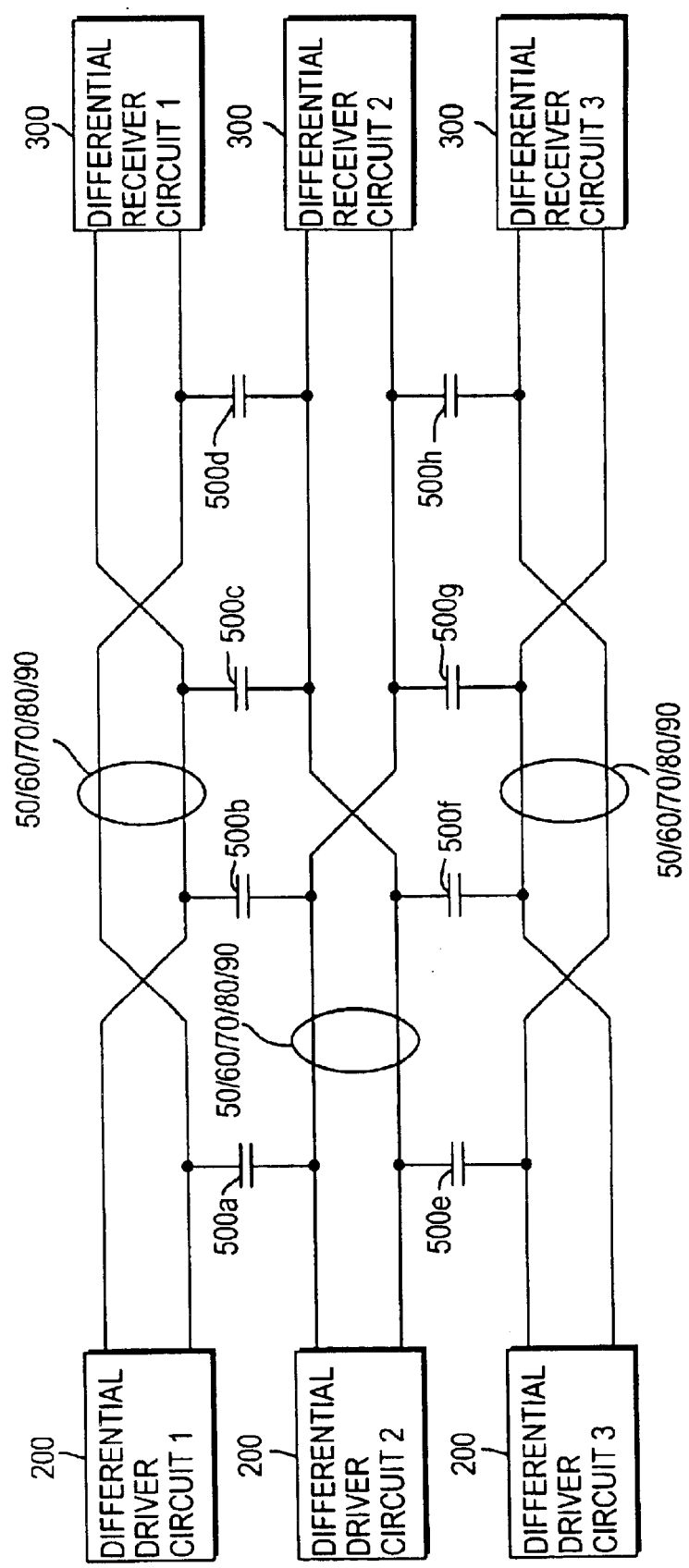
FIG. 14 is a simplified schematic block diagram useful in illustrating and explaining an optional aspect of the invention.

FIG. 14 illustrates how certain portions of the interconnection resources on PLD 10 (FIG. 1) can be constructed to help further reduce the adverse effects of capacitive coupling between adjacent interconnection conductors. FIG. 14 shows three representative differential signaling paths on device 10. Each path includes two conductors of any type(s) 50, 60, 70, 80, and/or 90. Each path is shown extending from an associated differential driver 200 to an associated differential receiver 300. The three paths 50/60/70/80/90 extend substantially parallel and adjacent to one another. For that reason, parasitic capacitive coupling can be expected to occur between the paths, especially between the conductors in two adjacent paths that are closest to one another. This unwanted but unavoidable capacitive coupling is indicated by the capacitor symbols 500 in FIG. 14.

To reduce the adverse effects of capacitive coupling 500, the two conductors 50/60/70/80/90 of each differential signaling path are reversed (as shown in FIG. 14) at periodic intervals along the length of the path. The interval lengths used in adjacent paths are preferably different so that for at least some segments of each path the capacitive coupling from the adjacent path(s) tends to be self-cancelling. As shown in FIG. 14, for example, the conductors in the top-most path reverse twice so that the top-most path is effectively divided into three approximately equal-length segments. The same 's true for the bottom-most path. The conductors in the middle path, however, reverse only once so that the middle path is effectively divided into two approximately equal-length segments. Because the middle path conductors reverse near the midpoint of the center segment of the upper and lower paths, the capacitive coupling in either direction indicated by elements 500b and 500c tends to be self-cancelling. The same is true for capacitive coupling in either direction indicated by elements 500f and 500g. It will be apparent from consideration of FIG. 14 that capacitive coupling in either direction indicated by elements 500a and 500d also tends to be self-cancelling. The same is true for capacitive coupling in either direction indicated by elements 500e and 500h.

The conductors 50/60/70/80/90 in each differential signaling path in FIG. 14 are reversed by having one conductor cross over the other conductor at each point of reversal. It may be convenient to refer to conductors that are thus configured as "twisted."

Figure 15:
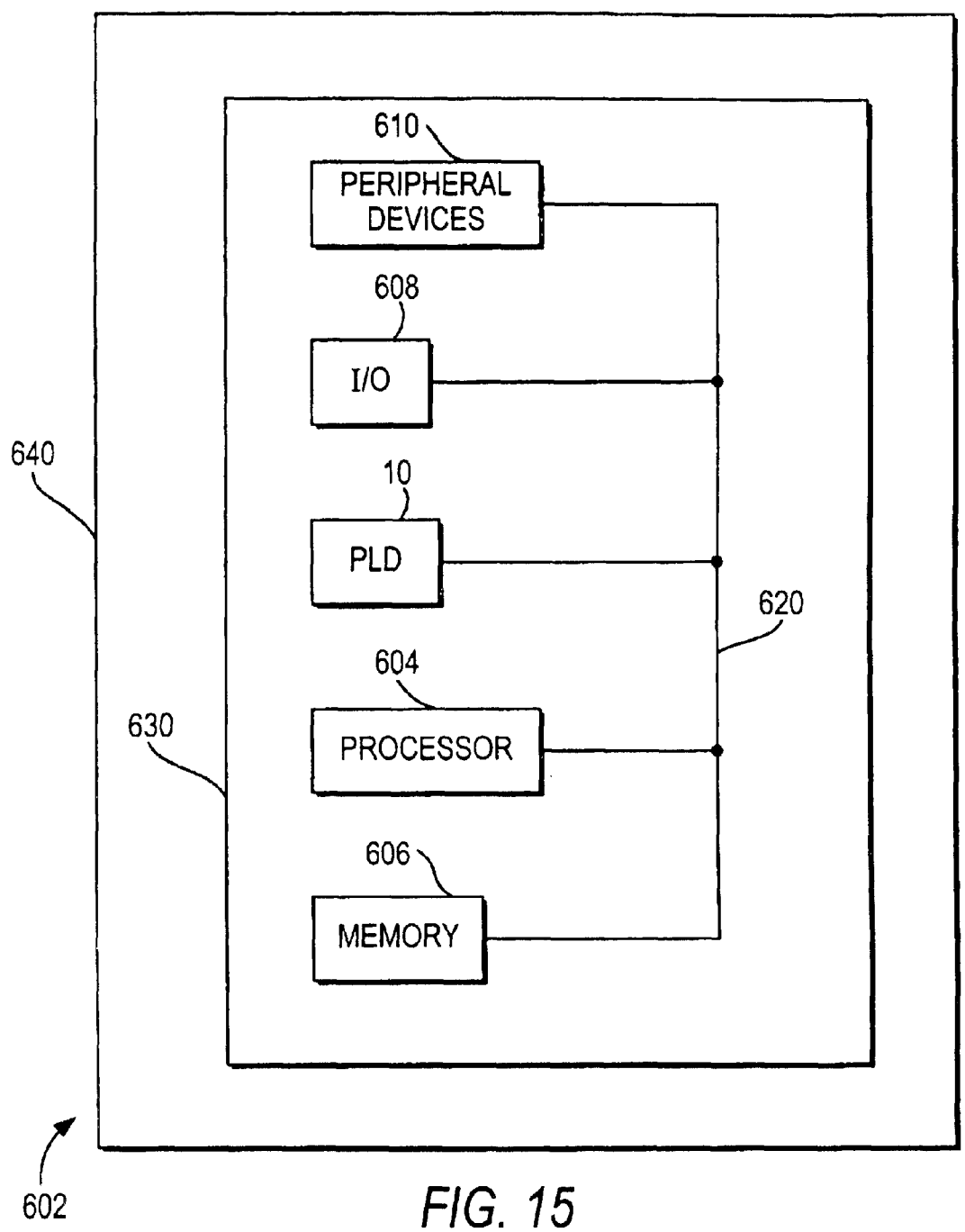
FIG. 15 is a simplified block schematic diagram of an illustrative system employing a programmable logic device having differential signaling in accordance with the invention.

FIG. 15 illustrates a programmable logic device 10 of this invention in a data processing system 602. Data processing system 602 may include one or more of the following components: a processor 604; memory 606; I/O circuitry 608; and peripheral devices 610. These components are coupled together by a system bus 620 and are populated on a circuit board 630 which is contained in, an end-user system 640.

System 602 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 604. Programmable logic device 10 may also be used as an arbiter for arbitrating access to a shared resource in system 602. In yet another example, programmable logic device 10 can be configured as an interface between processor 604 and one of the other components in system 602. It should be noted that system 602 is only exemplary, and that the true scope and spirit of the invention should be indicated by the following claims.

Various technologies can be used to implement programmable logic devices 10 having the differential signaling capabilities of this invention, as well as the various components of those devices (e.g., the above-described PLCs and the FCEs that control the PLCs). For example, each PLC can be a relatively simple programmable connector such as a switch or a plurality of switches for connecting any one of several inputs to an output. Alternatively, each PLC can be a somewhat more complex element that is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMS, DRAMs, first-in first-out ("FIFO") memories, EPROMs, EEPROMS, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the foregoing is only illustrative of the principles of the invention, and that various modifications can be made by those skilled in the art without departing from the scope and spirit of the invention. For example, the various elements of this invention (e.g., differential driver circuitry(ies), differential interconnection conductors, differential switching circuitry(ies), and differential receiver circuitry(ies)) can be provided on a PLD in any desired numbers and arrangements.

What is claimed is:

1. A programmable logic device having programmable logic device circuitry comprising:
   operational circuitry, wherein the operational circuitry includes:
      at least one programmable logic region; and
      at least one input/output circuitry region; and differential interconnection circuitry, wherein the differential interconnection circuitry includes:
  differential driver circuitry coupled to an output of at least a first one of the regions of the operational circuitry;
  differential receiver circuitry coupled to an input of at least a second one of the regions of the operational circuitry; and
  a pair of conductors extending from the driver circuitry to the receiver circuitry, wherein the interconnection circuitry is configured to convey signal information from at least the first region of operational circuitry to at least the second region of operational circuitry.

2. A programmable logic device comprising:
signal source circuitry;
signal destination circuitry; and
differential interconnection circuitry, wherein the interconnection circuitry comprises:
  differential driver circuitry coupled to the source circuitry;
  differential receiver circuitry coupled to the destination circuitry; and
  a pair of conductors extending from the driver circuitry to the receiver circuitry, wherein the interconnection circuitry is configured to convey signal information from the source circuitry to the destination circuitry, and wherein the differential driver circuitry comprises:
    programmably controlled connections to the conductors.

3. A programmable logic device comprising:
signal source circuitry;
signal destination circuitry; and
differential interconnection circuitry, wherein the interconnection circuitry comprises;
  differential driver circuitry coupled to the source circuitry;
  differential receiver circuitry coupled to the destination circuitry; and
  a pair of conductors extending from the driver circuitry to the receiver circuitry, wherein the interconnection circuitry is configured to convey signal information from the source circuitry to the destination circuitry, and wherein the receiver circuitry comprises:
    programmably controlled connections to the conductors.

4. A programmable logic device comprising:
signal source circuitry;
signal destination circuitry; and
differential interconnection circuitry, wherein the interconnection circuitry comprises:
  differential driver circuitry coupled to the source circuitry; and
  differential receiver circuitry coupled to the destination circuitry; and
  a pair of conductors extending from the driver circuitry to the receiver circuitry, wherein the interconnection circuitry is configured to convey signal information from the source circuitry to the destination circuitry, and wherein the pair of conductors comprises:
    a first pair of conductor segments extending from the driver circuitry;
    a second pair of conductor segments extending to the receiver circuitry; and
    differential switching circuitry configured to selectively connect the first pair of conductor segments to the second pair of conductor segments.

5. The programmable logic device defined in claim 4 wherein the differential switching circuitry comprises:
  programmably controlled connections to the first pair of conductor segments.

6. The programmable logic device defined in claim 4 wherein the differential switching circuitry comprises:
  programmably controlled connections to the second pair of conductor segments.

7. The programmable logic device defined in claim 2 wherein the interconnection circuitry further comprises:
  a further signal lead extending adjacent and substantially parallel to at least a portion of the conductors, and wherein in the portion of the conductors the conductors cross over one another at least once to reduce adverse effects of capacitive coupling between the conductors and the further signal lead.

8. A programmable device comprising:
signal source circuitry;
signal destination circuitry; and
differential interconnection circuitry, wherein the interconnection circuitry comprises:
  differential driver circuitry coupled to the source circuitry;
  differential receiver circuitry coupled to the destination circuitry; and
  a pair of conductors extending from the driver circuitry to the receiver circuitry; wherein the interconnection circuitry is configured to convey signal information from the source circuitry to the destination circuitry, and wherein the driver circuitry is configured to switch a pair of differential output signals between a first state in which the output signals have respective different output voltages and a second state in which the output signals have a substantially common voltage.

9. The programmable logic device defined in claim 8 wherein the common voltage is approximately half-way between the different output voltages.

10. The programmable logic device defined in claim 8 wherein the common voltage is a floating voltage.

11. A programmable logic device comprising:
signal source circuitry;
signal destination circuitry; and
differential interconnection circuitry; wherein the interconnection circuitry comprises:
  differential driver circuitry coupled to the source circuitry;
  differential receiver circuitry coupled to the destination circuitry; and
  a pair of conductors extending from the driver circuitry to the receiver circuitry, wherein the interconnection circuitry is configured to convey signal information from the source circuitry to the destination circuitry, and wherein the driver circuitry is configured to switch a pair of differential output signals between a first state in which a first of the output signals has a higher voltage than a second of the output signals, and a second state in which the second output signal has a higher voltage then the first output signal.

12. A digital processing system comprising:
processing circuitry;
a memory coupled to said processing circuitry; and
a programmable logic device as defined in claim 2 coupled to the processing circuitry and the memory.

13. A printed circuit board on which is mounted the programmable logic device as defined in claim 2.

14. The printed circuit board defined in claim 13 further comprising:
   a memory mounted on the printed circuit board and coupled to the programmable logic device.

15. The printed circuit board defined in claim 13 further comprising:
   processing circuitry mounted on the printed circuit board and coupled to the programmable logic device.

16. A programmable logic device having programmable logic device circuitry comprising:
   source circuitry configured for use in providing a first single-conductor signal, wherein the source circuitry comprises at least one of the elements from the group consisting of the following: i) a programmable logic region, ii) an input/output circuitry region, and iii) a memory region;
   differential driver circuitry configured to convert the first single-conductor signal to a pair of differential signals;
   a pair of interconnection conductors configured to convey the differential signals away from the driver circuitry;
   differential receiver circuitry configured to receive the differential signals from the interconnection conductors and to produce a second single-conductor signal indicative of the differential signals; and
   destination circuitry configured for use in receiving and utilizing the second single-conductor signal, wherein the destination circuitry comprises at least one of the elements from the group consisting of the following: iv) a programmable logic region, v) an input/output circuitry region, and vi) a memory region.

17. A programmable logic device comprising:
   a source of a single-conductor signal;
   differential driver circuitry configured to convert the single-conductor signal to a pair of differential signals;
   a pair of interconnection conductors configured to convey the different signals away from the driver circuitry;
   differential receiver circuitry configured to receive the differential signals from the interconnection conductors and to produce a second single-conductor signal indicative of the differential signals; and
   destination circuitry configured to receive and utilize the second single-conductor signal, wherein the interconnection conductors comprise:
      a first pair of conductor segments extending from the driver circuitry;
      a second pair of conductor segments extending to the receiver circuitry; and
      differential switching circuitry configured to programmably connect the first pair of conductor segments to the second pair of conductor segments.

18. The programmable logic device defined in claim 17 wherein the differential switching circuitry comprises:
   programmably controlled connections to the first pair of conductor segments.

19. The programmable logic device defined in claim 17 wherein the differential switching circuitry comprises:
   programmably controlled connections to the second pair of conductor segments.

20. A programmable logic device comprising:
   a source of a single-conductor signal;
   differential driver circuitry configured to convert the single-conductor signal to a pair of differential signals;
   a pair of interconnection conductors configured to convey the differential signals away from the driver circuitry;
   differential receiver circuitry configured to receive the differential signals from the interconnection conductors and to produce a second single-conductor signal indicative of the different signals;
   destination circuitry configured to receive and utilize the second single-conductor signal;
   programmably controlled connections between the driver circuitry and the interconnection conductors; and
   a further interconnection conductor extending adjacent and substantially parallel to at least a portion of the interconnection conductors, wherein the portion of the interconnection conductors are twisted to reduce adverse effects of capacitive coupling between the interconnection conductors and the further interconnection conductor.

21. A programmable logic integrated circuit device having programmable logic device circuitry comprising:
   signal source circuitry configured for use in providing a signal;
   differential driver circuitry configured to convert a single signal from the signal source circuitry to a pair of differential signals;
   differential interconnection circuitry configured to convey the differential signals away from the driver circuitry;
   differential receiver circuitry configured to receive the differential signals from the interconnection circuitry and to convert the differential signals to a second single signal; and
   signal destination circuitry configured for use in receiving the second single signal, wherein the driver circuitry comprises:
      programmable circuitry configured to selectively apply the differential signals to the interconnection circuitry.

22. A programmable logic integrated circuit device having programmable logic device circuitry comprising:
   signal source circuitry configured for use in providing a signal;
   differential driver circuitry configured to convert a single signal from the signal source circuitry to a pair of differential signals;
   differential interconnection circuitry configured to convey the differential signals away from the driver circuitry;
   differential receiver circuitry configured to receive the differential signals from the interconnection circuitry and to convert the differential signals to a second single signal; and
   signal destination circuitry configured for use in receiving the second single signal, wherein the interconnection circuitry comprises:
   programmable circuitry configured to selectively apply the differential signals to the receiver circuitry.

23. A programmable logic integrated circuit device comprising:
   signal source circuitry;
   differential driver circuitry configured to convert a single signal from the signal source circuitry to a pair of differential signals;
   differential interconnection circuitry configured to convey the differential signals away from the driver circuitry;
   differential receiver circuitry configured to receive the differential signals from the interconnection circuitry and to convert the differential signals to a second single signal; and signal destination circuitry configured to receive the second single signal, wherein the interconnection circuitry comprises:
- a first pair of interconnection conductors extending from the driver circuitry;
- a second pair of interconnection conductors extending to the receiver circuitry; and
- programmable circuitry configured to selectively connect the first pair of interconnection conductors to the second pair or interconnection conductors.

24. A programmable logic integrated circuit device having programmable logic device circuitry comprising:

signal source circuitry configured for use in providing a signal;

differential driver circuitry configured to convert a single signal from the signal source circuitry to a pair of differential signals;

differential interconnection circuitry configured to convey the differential signals away from the driver circuitry;

differential receiver circuitry configured to receive the differential signals from the interconnection circuitry and to convert the differential signals to a second single signal; and signal destination circuitry configured for use in receiving the second single signal, wherein the interconnection circuitry comprises first and second interconnection conductors, wherein the programmable logic integrated circuit device further comprises a further interconnection conductor adjacent and substantially parallel to at least a portion of the first and second interconnection conductors, wherein the portion the fist and second interconnection conductors are twisted to reduce adverse effects of capacitive coupling between the first and second interconnection conductors and the further interconnection conductor.

* * * * *